(12) United States Patent
Sieben et al.

(10) Patent No.: US 6,916,673 B2
(45) Date of Patent: Jul. 12, 2005

(54) METHOD FOR PRODUCING AN OPTICAL TRANSMITTING AND RECEIVING DEVICE AND A TRANSMITTING AND RECEIVING DEVICE PRODUCED ACCORDING TO SAID METHOD

(75) Inventors: Ulrich Sieben, Reute (DE); Günter Igel, Teningen (DE)

(73) Assignee: Micronas GmbH, Freiburg (DE)

( * ) Notice: Subject to any disclaimer, the term of this patent is extended or adjusted under 35 U.S.C. 154(b) by 0 days.

(21) Appl. No.: 10/169,008

(22) PCT Filed: Dec. 19, 2000

(86) PCT No.: PCT/EP00/12936

§ 371 (c)(1),
(2), (4) Date: Nov. 4, 2002

(87) PCT Pub. No.: WO01/47034

PCT Pub. Date: Jun. 28, 2001

(65) Prior Publication Data

US 2003/0173561 A1 Sep. 18, 2003

(30) Foreign Application Priority Data

Dec. 22, 1999 (DE) .......................................... 199 62 442

(51) Int. Cl.⁷ ............................................... H01L 21/00
(52) U.S. Cl. ......................................... 438/24; 438/23
(58) Field of Search ............................................ 438/24

(56) References Cited

U.S. PATENT DOCUMENTS

| 3,881,113 A |   | 4/1975 | Rideout et al. ............. 250/551 |
| 4,766,471 A | * | 8/1988 | Ovshinsky et al. ............ 257/53 |
| 5,039,490 A |   | 8/1991 | Marsoner et al. ......... 422/82.01 |
| 5,285,078 A |   | 2/1994 | Mimura et al. ................ 257/59 |
| 5,619,046 A |   | 4/1997 | Engström et al. ............. 257/82 |
| 5,629,534 A |   | 5/1997 | Inuzuka et al. ................ 257/84 |
| 5,753,928 A | * | 5/1998 | Krause ........................ 250/551 |
| 5,903,016 A |   | 5/1999 | Whitney ....................... 257/84 |

FOREIGN PATENT DOCUMENTS

| DE | 1 186 958   |   | 2/1965  |
| DE | 43 01 940   |   | 7/1993  |
| DE | 42 32 587   |   | 3/1994  |
| DE | 19635215    |   | 3/1998  |
| JP | 55145380    | * | 11/1980 |
| JP | 09089773    | * | 4/1997  |
| JP | 10223925    |   | 8/1998  |
| WO | WO 97/42478 |   | 5/1997  |

OTHER PUBLICATIONS

Patents Abstracts of Japan. E–43, vol. 5/No. 15, Jan. 29, 1981.

Patents Abstracts of Japan. E–777, vol. 13/No. 272, Jun. 22, 1989.

van Drieënhuizen et al. Optocoupler based on the avalanche light emission in silicon. Elsevier Sequoia, 1992.

* cited by examiner

*Primary Examiner*—Douglas Wille
(74) *Attorney, Agent, or Firm*—O'Shea, Getz & Kosakowski, PC

(57) ABSTRACT

The invention relates to a method for producing an optical transmitting and receiving device (1, 1*a*) comprising a light emitting transmission element (3, 3*a*) and a receiving element (4, 4*a*) which converts this light into an electrical magnitude. The transmission and receiving elements are inserted into a silicon substrate. The optical transmitting and receiving device (1) is preferably inserted in a monolithic manner into a common substrate, comprising a sequence of superimposed layers for the light emitting transmission element (3) and the light receiving element (4). An electrically insulating intermediate layer (9, 9*a*) is incorporated between the transmission and receiving element.

25 Claims, 1 Drawing Sheet

METHOD FOR PRODUCING AN OPTICAL TRANSMITTING AND RECEIVING DEVICE AND A TRANSMITTING AND RECEIVING DEVICE PRODUCED ACCORDING TO SAID METHOD

BACKGROUND OF THE INVENTION

The present invention relates to a method for producing an optical transmitting and detecting device including a light-emitting transmitting element as well as a detecting element to convert this light into an electrical quantity, the transmitting and detecting element being incorporated into a silicon substrate.

A known approach exists in which this type of transmitting and detecting system is arranged sequentially on a frame to form an optocoupler, but the approach is complex due to the associated process of bending and precise assignment. Electrical insulation is created between the transmitting and detecting systems by providing, for example, an intermediary plastic or lacquer or similarly optically-transparent material.

The publication by S. M. Sze, *Physics of Semiconductor Devices*, $2^{nd}$ edition, page 699 discloses an optocoupler which has an LED as the optical transmitting element and a silicon phototransistor as the light detector arranged on both sides of a glass insulator. Here again, a complex assembly technology is required both for production and for aligning an optical coupling which significantly affects the cost of production.

Optical transmitting elements (LEDs) are constructed on the basis of gallium arsenide, gallium arsenide phosphide, or gallium phosphide due in part to the high efficiency achieved. However, a disadvantage of these compound semiconductors is their poor mechanical properties in comparison to silicon, as well as the problem of integration into silicon-based systems.

To integrate optical systems based on GaAs, GaAsP, or GaP, the approach has also been suggested of incorporating a receptacle recess in the silicon substrate in which the optical system is then inserted and, for example, joined to the silicon system by bonding. An optical link can then be created, for example, by lateral emission from the optical gallium arsenide system to the silicon system. This approach too requires a complex assembly technology.

The publication *Sensors and Actuators A* 31 (1992) pp. 229–240 discloses an optocoupler in which the light source is an avalanche silicon diode. The optocoupler has arranged adjacent to one another on a substrate the avalanche diode as the light source and the light detector in the form of a photodiode. This arrangement requires a comparatively large chip surface area. In addition, the transmitter and detector are not dielectrically separated. Finally, certain measures are required to facilitate the lowest-possible-loss transmission of light between the transmitter and the detector another factor increasing the complexity of production.

Therefore, there is a need for a relatively low cost optical transmitting and detecting device, as well as a device that utilizes a relatively small amount of chip area, and a method of producing such a device.

SUMMARY OF THE INVENTION

Briefly, according to an aspect of the invention, an optical transmitting and detecting device is monolithically incorporated into a common substrate having a stacked sequence of layers for the light-transmitting element and the light-detecting element, and that an electrically insulating interlayer is inserted between the transmitting element and the detecting element.

The space requirement for the chip area is considerably reduced (e.g., almost to half) due to the sandwiched stacked transmitting and detecting elements, while the spacing between the two elements is maintained as small as possible, thereby reducing transmission losses, or significantly enhancing transmission efficiency. As a result, the power of the transmitting element may be relatively small without this negatively affecting functionality. Specifically, the reduced light intensity of the silicon-based transmitting element, as compared to gallium arsenide systems, is still sufficient for reliable functioning even given low operating currents.

Another advantage is the electrical separation of the systems by the insulating interlayer—a required feature when using the device, for example, as an optocoupler.

In this first proposed approach for producing an optical transmitting and detecting device according to the invention, the transmitting and detecting elements are incorporated into a common substrate.

According to another independent proposed solution, the light-transmitting element and light-detecting element may each be incorporated into a silicon substrate, wherein at least one of the two transmitting and detecting chips thus formed is modified on the light-emitting or light-detecting side. The modification includes the insertion of a cavity into at least one of these sides, and the chips being joined with the light-emitting and the light-detecting sides facing each other.

A preferred use of this method is when modifications must be made between the transmitting and the detecting element such as creating interlayers, inserting a cavity, and the like. Since initially two systems are present on separate substrates, those sides which will later be joined and face each other are more easily accessible for such modifications—with the result that this production method offers simplification and advantages in terms of special modifications.

Preferably, the transmitting chip and detecting chip may be joined in sandwiched stacked form by bonding. Chip bonding is a common method available in a number of variants.

An optical transmitting and detecting device produced based on the method according to the invention including a light-emitting transmitting element as well as a detecting element to convert this light into an electrical quantity, the transmitting and the detecting element being incorporated into a silicon substrate.

In a first embodiment, the transmitting and detecting elements are arranged stacked in a common silicon substrate, and a dielectric interlayer is arranged between the transmitting element and the detecting element.

In a second embodiment, one silicon chip each is provided for the light-emitting element and for the light-detecting element, these chips being joined with the light-emitting and the light-detecting sides facing each other, and at least one cavity and/or at least one insulating layer and/or at least one wavelength-selective layer being provided.

The two embodiments have in common that the overall systems require a small chip area, and a short transmission path.

The second embodiment allows for simplified insertion of a preferably externally-accessible cavity, or of interlayers. An extremely compact analysis system is thereby created which may be employed to analyze liquids and gases present in the cavity.

These and other objects, features and advantages of the present invention will become more apparent in light of the following detailed description of preferred embodiments thereof, as illustrated in the accompanying drawings.

DETAILED DESCRIPTION OF THE INVENTION

Figure 1:
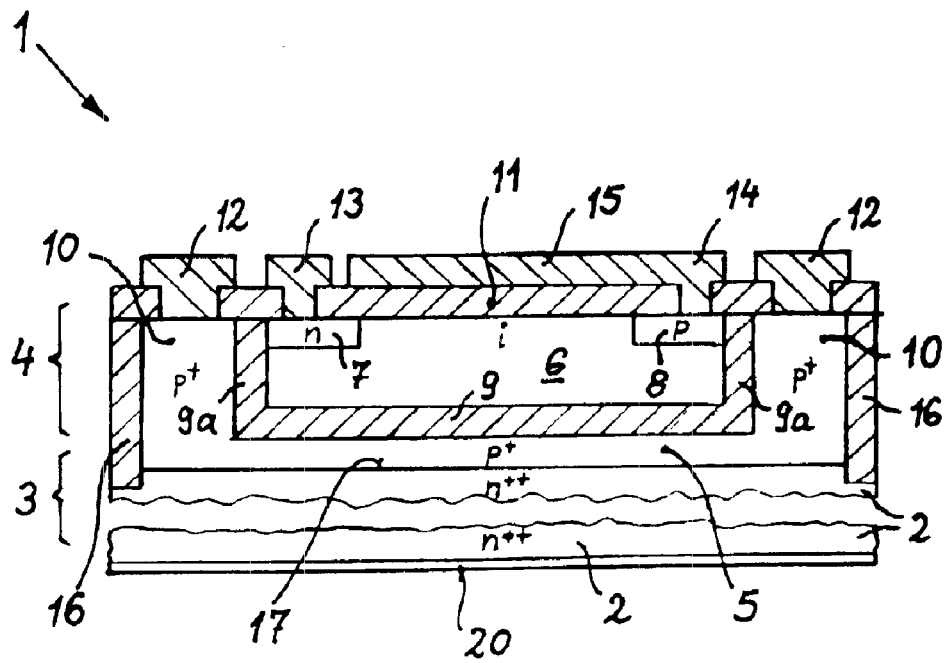
FIG. 1 is a cross section through an optical transmitting and detecting device.

An optical transmitting and detecting device 1 shown in FIG. 1 has, on a substrate 2, a sequence of layers for a transmitting element 3, and located above said element a sequence of layers for a detecting element 4.

To create transmitting element 3, an epitaxial layer 5 of a second doping type is applied to the heavily-doped silicon substrate 2 of a first doping type. The blocking layer between these two layers is the region of light emission.

After an intrinsic layer 6 has been applied to epitaxial layer 5, a layer 10 of the same doping type is diffused in, and extends up to epitaxial layer 5 of transmitting element 3. This the first pole. In the embodiment, the anode of transmitting element 3 is routed to the top side of the chip.

In this embodiment, the metallized bottom side of silicon substrate 2 forms the cathode terminal 20 of transmitting element 3. This terminal contact may also be routed to the top side if required.

In the embodiment, detecting element 4 is formed by a pin diode including intrinsic layer 6 and diffusion zones 7, 8 spaced laterally relative to each other therein. To produce detecting element 4, intrinsic layer 6 is applied to epitaxial layer 5 of the transmitting element, and the two zones 7 and 8 are diffused in. To obtain the electrical insulation of transmitting element 3 from detecting element 4, a dielectric interlayer 9, 9a is inserted between these elements. The interlayer is formed by an oxide layer.

The horizontal interlayer section 9 is formed by oxygen-implantation according to the SIMOX process.

The lateral interlayer sections 9a are formed by trench etching and trench sealing.

The top side of intrinsic layer 6 is provided with an oxide layer 11 as a protective coating. Finally, the surface is provided through a conventional bonding process with terminal contacts, the metallized top side of layer 10 forming the anode terminal 12 of transmitting element 3. The metallized top sides of the two diffusion zones 7 and 8 form the cathode terminal 13 and the anode terminal 14 for detecting element 4. A clearly seen feature is that anode terminal 14 extends over the rear side of detecting element 4, thereby forming a metal layer acting as a reflector 15. This metal layer enhances the efficiency of the detecting element.

Reflector 15 may also be isolated from the other metallic contact coatings.

If multiple transmitting and detecting devices 1 are arranged sequentially on a common substrate, an oxide layer 16 is provided for system isolation, the layer being formed by trench etching or trench sealing and extending from the top side of the chip beyond blocking layer 17 of transmitting element 3.

Oxide layer 16 is added simultaneously with interlayer 9a. During the trench-etching process, etching is halted when the etching agent (etching gas) reaches the horizontal silicon oxide layer 9. The adjacent external trenches, which are produced at the same time, do not meet this type of silicon oxide layer so that they can be made deeper and extend beyond blocking layer 17, thus creating the system isolation.

The arrangement of transmitting element 3 and detecting element 4 with its sandwiched stacked layering creates a short light transmission path in which practically only insulating interlayer 9 is located. The short transmission path means that only a low intensity is required for the light emitted by transmitting element 3 (i.e., transmitting element 3 may be operated with very low currents).

Detecting element 4 that is formed by a pin diode has an extremely high light sensitivity, and thus a high efficiency. This also contributes to the fact that the transmission side may be operated at a very low light output. This aspect is aided by the metallic layer acting as reflector 15 on the rear side of detecting element 4. As with contacts 12 through 14, this layer may be composed of aluminum, or also possibly of gold or another metal with high light reflectivity.

The transmitting and detecting device 1 may be provided sequentially in a multiple-element design in order to create a multichannel arrangement for the light transmission.

It must also be mentioned that the detecting element 4 may also be in the form of a phototransistor, photothyristor, photoresistor or similar light-sensitive element. It is also possible on the detecting side to integrate a following series-connected power switch so as to create, for example, a photo MOS relay.

The transmitting and detecting device 1 in FIG. 1 may be employed as an optocoupler for example.

Figure 2:
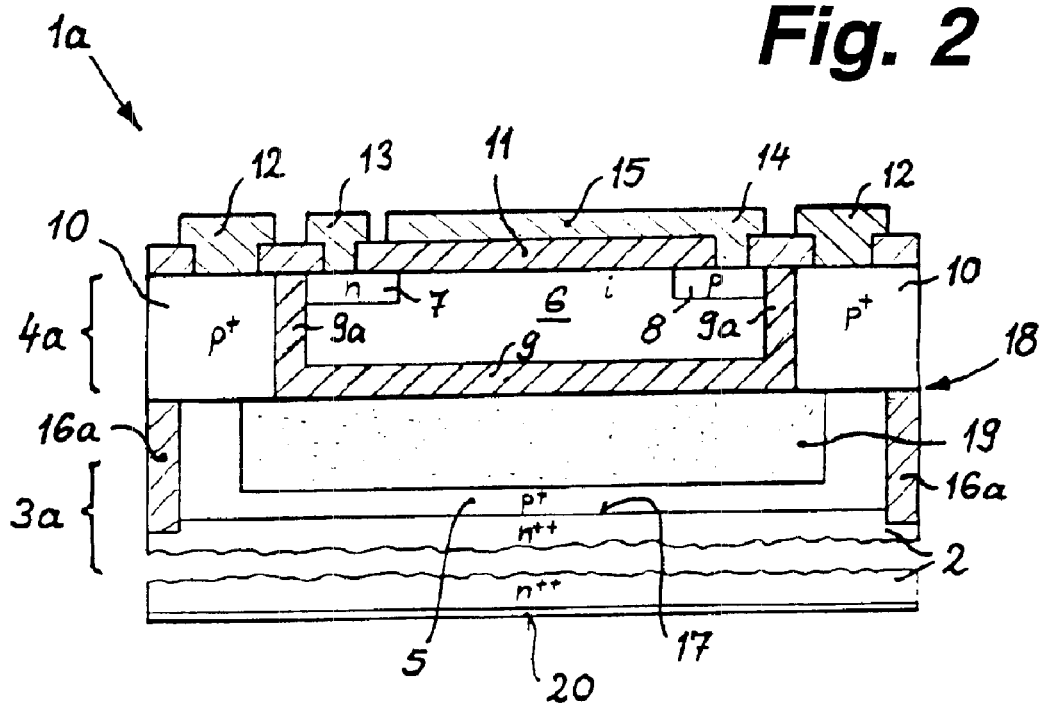
FIG. 2 is a cross section through an optical transmitting and detecting device that includes a cavity in the light transmission path.

FIG. 2 is a modified embodiment of a transmitting and detecting device 1a according to the invention. This embodiment first provides isolated, separate silicon chips for the transmitting element 3a and detecting element 4a. After their production, these are joined in bonding region 18 by chip bonding, with the light-emitting and light-detecting sides facing each other, thereby producing an embodiment approximately comparable to the embodiment of FIG. 1, wherein specifically here as well the layers of transmitting element 3 and the layers of detecting element 4 are arranged in a sandwiched stacked configuration.

In the embodiment of FIG. 2, a cavity 19 is located in the light transmission path between transmitting element 3a and detecting element 4a, the cavity being preferably accessible from the outside. In the embodiments cavity 19 is formed by removing silicon from the epitaxial layer 5. Since this side of the transmitting chip is freely accessible before bonding to the detecting chip, cavity 19 may be produced simply. The insulating interlayer 9 formed by the oxide layer may also be produced more easily before bonding due to the accessibility of the detecting chip side than in the embodiment of FIG. 1. If necessary, insulating interlayer 9 may be dispensed with if a gas is present in cavity 19 which creates a sufficient isolation and electrical insulation between the systems.

The coatings in the light transmission path may be provided for reasons other than insulation purposes. One possibility is to create a wavelength-selective filter layer, such as one composed of silicon nitride2, which transmits light only at a wavelength above 400 nm.

In addition to these wavelength-selective filter layers, almost any number of coatings may be applied to affect light transmission between transmitting element 3a and detecting element 4a.

The externally accessible cavity 19 may be filled or penetrated by a gaseous or liquid media. It is thus possible to determine the type of material, employ the material as a filter, etc. Analyses of these media may thus be performed in which the measurement reaction occurring is detected based on the specific material. For example, spectrometric analyses may be performed or certain media monitored for turbidity. This feature would enable monitoring of water quality, for example, or use as a fire detector in which smoke or the changed composition of the ambient air affects the transmission of light.

The arrangement of transmitting element 3a, cavity 19 and detecting element 4a thus create a very compact analysis system in a preferably constructed chip.

It should be mentioned that a cavity in the light transmission path may also be provided in the embodiment of FIG. 1, one created for example by underetching. Due to higher production costs for the embodiment of FIG. 1, preferably one or more microcavities are provided, whereas in the embodiment of FIG. 2 with its accessibility to the inner sides of the two chips, one or more cavities of any size and shape may be provided.

It should also be mentioned here that the cavity 19 may be included not only in the transmitting chip but also in the detecting chip.

Since transmitting and detecting device 1 and 1a are produced based on silicon technology, they may be readily integrated into other silicon-based systems. Since the systems are largely protected from ambient light, flip-chip assemble is also possible.

Although the present invention has been shown and described with respect to several preferred embodiments thereof, various changes, omissions and additions to the form and detail thereof, may be made therein, without departing from the spirit and scope of the invention.

What is claimed is:

1. Method for producing an optical transmitting and detecting device including a light-emitting transmitting element as well as a detecting element to convert this light into an electrical quantity, the transmitting and detecting element being incorporated into a silicon substrate, where the optical transmitting and detecting device is monolithically incorporated into a common substrate having a stacked sequence of layers for the light-transmitting element and the light-detecting element, and that an electrically insulating interlayer is inserted between the transmitting element and the detecting element.

2. The method of claim 1, wherein an epitaxial layer of as second doping type is applied to a heavily doped silicon substrate of a first doping type, thus creating the light-transmitting element.

3. The method of claim 2, wherein a sequence of layers is applied to the epitaxial layer of the light-transmitting element to form a detecting element, and that a dielectric interlayer is inserted between the layers of the light-transmitting element and the layers of the detecting element.

4. The method of claim 3, wherein an intrinsic layer is epitaxially applied to the epitaxial layer of the light-transmitting element to form the light-detecting element, into which intrinsic layer laterally spaced zones of different doping types are diffused.

5. The method of claim 4, wherein layers of the second doping type are each diffused laterally into the layer of the detecting element, the layers extending up to the epitaxial layer of the same doping type of the transmitting element.

6. The method of claim 5, wherein a first oxide layer forming the dielectric interlayer is created by oxygen implantation, and that subsequent a second oxide layer extending up to the surface and surrounding the detecting element is created by trench etching or trench sealing.

7. The method of claim 6, wherein a plurality of transmitting and detecting systems are produced adjacent to one another on a wafer.

8. The method of claim 7, wherein an oxide layer extending from the top side of the chip and beyond the blocking layer of the transmitting element is created to separate adjacent transmitting and detecting systems, by trench etching and trench sealing, with the incorporation of the oxide layer surrounding the detecting element.

9. The method of claim 8, wherein at least one, externally-accessible cavity is incorporated between the sequence of layers of the light-transmitting element and the sequence of layers of the light-detecting element.

10. A method for producing an optical transmitting and detecting device including a light-emitting transmitting element as well as a detecting element to convert this light into an electrical quantity, the transmitting and detecting element being incorporated into a silicon substrate, where the light-transmitting element and the light-detecting element are each incorporated into a silicon substrate, that at least one of the two thus-formed transmitting and detecting elements is modified at the light-emitting or light-detecting side, that through this modification a cavity is inserted in at least one of these sides, and that the elements are joined with the light-emitting and light-detecting sides facing each other.

11. The method of claim 10, wherein the transmitting element and the detecting element are joined by bonding to each other in a sandwiched stacked configuration.

12. The method of claim 10, wherein to create the transmitting element, an epitaxial layer of a second doping type is applied to a heavily doped silicon substrate.

13. The method of claim 10, wherein a multiplicity of transmitting elements are created on a first wafer, and a multiplicity of detecting elements are created on a second wafer, and that the two wafers are joined with their respective elements by wafer bonding.

14. The method of claim 13, wherein the externally-accessible cavity is inserted in the transmitting element on the side within the light transmission region facing the detecting element.

15. The method of claim 10, wherein the cavity is filled with a gaseous or liquid medium.

16. The method of claim 15, where at least one insulating layer and/or at least one wavelength-selective filter layer, is inserted into the sides of the transmitting elements and detecting elements facing each other.

17. The method of claim 16, wherein the terminal contacts for the light-detecting element and the light-transmitting element are produced by diffusion technology and metallization.

18. The method of claim 17, wherein during metallization of the terminal contacts, a metal coating acting as a reflector and covering the rear side of the detecting element is applied.

19. The method of claim 10, wherein the light-detecting element is coupled to an integrated power switch.

20. An optical transmitting and detecting device including a light-emitting transmitting element as well as a detecting element to convert light into an electrical quantity, the transmitting and the detecting element being incorporated into a silicon substrate, where the optical transmitting and detecting elements are arranged in a stacked configuration in a common silicon substrate, and that a dielectric interlayer is located between the transmitting element and the detecting element.

21. The optical transmitting and detecting device of claim 20, wherein one silicon chip each is provided for the light-transmitting element and for the light-detecting element, that these chips are joined with the light-transmitting element and the light-detecting sides facing each other.

22. The optical transmitting and detecting device of claim 20, wherein the light-detecting element comprises a pin diode.

23. The optical transmitting and detecting device of claim 20, wherein said device is configured and arranged as an optocoupler, an includes a power switch on the detector side.

24. The optical transmitting and detecting device of claim 20, wherein said device has at least one externally-accessible cavity between the transmitting elements and the detecting element, and is configured and arranged as an analysis system for spectrometric analyses.

25. The optical transmitting and detecting device of claim 20, wherein said device has at least one externally accessible cavity between the light-transmitting elements and the light-detecting element, and is configured and arranged as a fire detector.

* * * * *

UNITED STATES PATENT AND TRADEMARK OFFICE
CERTIFICATE OF CORRECTION

PATENT NO. : 6,916,673 B2  Page 1 of 1
DATED : July 12, 2005
INVENTOR(S) : Sieben et al.

It is certified that error appears in the above-identified patent and that said Letters Patent is hereby corrected as shown below:

Column 1,
Line 58, after "detector" insert -- - --.

Column 4,
Line 47, after "In the" delete "embodiments" and insert -- embodiment --.
Line 60, after "silicon" delete "nitride2" and insert -- nitride1 --.

Column 5,
Line 29, before "is" delete "assemble" and insert -- assembly --.
Line 51, after "layer of" delete "as" and insert -- a --.
Line 67, delete "that subsequent".

Column 7,
Line 12, after "octocoupler" delete "an" and insert -- and --.

Column 8,
Line 3, after "transmitting" delete "elements" and insert -- element --.

Signed and Sealed this

Twenty-seventh Day of September, 2005

JON W. DUDAS
*Director of the United States Patent and Trademark Office*